(12) United States Patent
Boutaghou

(10) Patent No.: US 7,129,179 B2
(45) Date of Patent: Oct. 31, 2006

(54) METHOD FOR TOPOGRAPHICAL PATTERNING OF A DEVICE

(75) Inventor: Zine Eddine Boutaghou, Vadnais Heights, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 455 days.

(21) Appl. No.: 09/905,037

(22) Filed: Jul. 13, 2001

(65) Prior Publication Data

US 2002/0135266 A1 Sep. 26, 2002

Related U.S. Application Data

(60) Provisional application No. 60/218,263, filed on Jul. 13, 2000.

(51) Int. Cl.
*H01L 21/302* (2006.01)

(52) U.S. Cl. .............. 438/712; 438/706; 438/710; 216/41

(58) Field of Classification Search ......... 438/706, 438/710, 712, 720, 717; 216/41, 46, 22, 216/58

See application file for complete search history.

(56) References Cited

U.S. PATENT DOCUMENTS

| | | | |
|---|---|---|---|
| 4,035,062 A | 7/1977 | Fletcher et al. ............. 350/162 |
| 4,567,104 A | 1/1986 | Wu ............................ 428/410 |
| 4,581,814 A * | 4/1986 | Celler et al. ................ 438/404 |
| 4,670,366 A | 6/1987 | Wu ............................ 430/13 |
| 4,894,303 A | 1/1990 | Wu ............................ 430/13 |
| 5,001,080 A * | 3/1991 | Wada et al. ................ 438/23 |
| 5,078,771 A | 1/1992 | Wu ............................ 65/30.11 |
| 5,079,130 A | 1/1992 | Derkits ....................... 430/321 |
| 5,114,813 A | 5/1992 | Smoot et al. ................ 430/5 |
| 5,126,006 A | 6/1992 | Cronin et al. ............... 156/643 |
| 5,145,757 A | 9/1992 | Smoot et al. ................ 430/5 |
| 5,192,699 A * | 3/1993 | Bulat et al. ................. 438/192 |
| 5,213,916 A | 5/1993 | Cronin et al. ............... 430/321 |
| 5,242,707 A | 9/1993 | Esener et al. ............ 427/126.3 |
| 5,285,438 A | 2/1994 | Marchand et al. ......... 369/103 |
| 5,285,517 A | 2/1994 | Wu ............................ 385/142 |
| 5,310,623 A | 5/1994 | Gal ............................ 430/321 |
| 5,316,640 A * | 5/1994 | Wakabayashi et al. .. 204/192.34 |
| 5,334,467 A | 8/1994 | Cronin et al. ................ 430/5 |
| 5,456,798 A * | 10/1995 | Koumura et al. ............. 216/66 |
| 5,480,764 A | 1/1996 | Gal et al. .................... 430/321 |
| 5,508,803 A | 4/1996 | Hibbs et al. ................ 356/243 |
| 5,521,781 A | 5/1996 | Kaneko et al. ............. 360/135 |
| 5,538,817 A | 7/1996 | Smith et al. ................ 430/5 |
| 5,804,084 A | 9/1998 | Nasby et al. ................ 216/2 |
| 5,853,959 A * | 12/1998 | Brand et al. ............... 430/320 |
| 6,107,000 A | 8/2000 | Lee et al. ................... 430/296 |
| 6,335,224 B1 * | 1/2002 | Peterson et al. ............ 438/114 |
| 6,344,383 B1 * | 2/2002 | Berry et al. ................ 438/221 |

* cited by examiner

*Primary Examiner*—Lan Vinh

(57) ABSTRACT

The device of the present invention facilitates engaging mating elements, such as actuators used in disc drives, with a pattern on the device. The improved device includes arcuate edges between at least one of the sidewalls in the pattern and the surface of the device. The arcuate edges minimize some of the fracturing of the device that typically occurs when a mating element is inserted on or into the device. The present invention also relates to a method of fabricating a device. The method comprises positioning a mask in the form of a pattern relative to the device, and then etching the pattern into a surface on the device to form at least one sidewall and an arcuate edge such that the arcuate edge extends between the surface on the device and one of the sidewalls.

20 Claims, 7 Drawing Sheets

METHOD FOR TOPOGRAPHICAL PATTERNING OF A DEVICE

RELATED APPLICATION

This application claims the benefit of U.S. Provisional Application Ser. No. 60/218,263, filed Jul. 13, 2000 under 35 U.S.C. 119(e).

FIELD OF THE INVENTION

The present invention relates to the field of semiconductor devices and similar devices fabricated using masking and photolithography techniques. More particularly, this invention relates to fabricating a device that reduces internal stresses and prevents chipping or cracking when other elements are inserted therein or when handled.

BACKGROUND OF THE INVENTION

There are many classes of devices. One such class are MEMS ("micro electromechanical systems") devices. MEMS devices are a class of systems that are physically small. These systems have both electrical and mechanical components. MEMS originally used modified integrated circuit (computer chip) fabrication techniques and materials to create these very small mechanical devices. Today there are many more fabrication techniques and materials available. One such fabrication technique includes sacrificial polysilicon surface micromachining which is a technology that enables the mass production of complex MEMS by themselves or MEMS integrated with microelectronic systems. This technology has already been successfully commercialized as acceleration sensors for automobile airbag deployment.

There are many wide ranging application for MEMS devices. Two main categories of MEMS devices are sensors and actuators. Micro sensors are useful because their small physical size allows them to be much less invasive. Micro actuators are useful because the amount of work they perform is very precise. A polysilicon resonator transducer is an example of a MEMS sensor which uses stress controlled thin film polysilicon process to form a mechanically free beam of polysilicon having resonant frequency can be measured electronically. Environmental changes can be converted to a changes in resonant frequency of the micro beam. The environmental changes can be sensed.

Other MEMS devices include magnetic micro motors fabricated by a deep x-ray lithography and electrode position process. The rotor is magnetically salient to allow a magnetic field applied to each of the two poles to cause the rotor to turn. External loading gears can be added. Gears are fabricated that are 100 microns tall. Techniques for forming MEMS devices can be used to create parts of systems where high tolerances are necessary which can bridge the gap between MEMS and traditionally machined precise components. MEMS are used to clean and treat semiconductor devices, low-voltage switches for radio frequency applications, micro-relay modules, spray nozzles for ink jet printers, and actuators for optical scanners, just to name a few. MEMS devices are becoming widely used in various industries. For example, in the automotive industry MEMS pressure sensors measure engine oil pressure, vacuum pressure, fuel injection pressure, transmission fluid pressure, various line pressures, tire pressure, and stored air bag pressures. MEMS temperature sensors can be used to monitor oil, antifreeze, and air temperatures. Other industries are also finding uses for MEMS devices. For example, in the disc drive industry MEMS devices are being contemplated to use as microactuators to very precisely position magnetic transducers over very closely packed tracks containing data.

MEMS devices are typically fabricated by overlaying a semiconductor wafer made from silicon with layers of oxides, metals and other materials necessary for circuit construction. Patterns are formed on and within these layers in order to make a circuit plan of the device. The patterns usually include elements for two-dimensional and three-dimensional interactions of the MEMS device circuit plan.

The patterns are formed in the MEMS device by a combination of masking and etching. Masking includes fabricating a mask that is in the form of a pattern and then positioning the mask on, or near, the surface of the MEMS device. The mask establishes how the MEMS device is to be etched. It is etching the MEMS device that permanently places the pattern into the MEMS device. Etching is typically done by removing the top layer(s) from the MEMS device in those areas that are either covered or uncovered by the mask depending on the type of etching that is used to remove the layer(s). Etching processes are either wet or dry, and the goal of any etching process is to transfer the desired pattern to the MEMS device.

Semiconductors are another class of devices that are formed using photolithography, masking and etching. It is contemplated that other devices will also be formed using these techniques.

One known masking method is photolithography which involves forming a pattern onto a photomask and then transferring the pattern to a radiation sensitive layer that has been placed on a semiconductor substrate. The radiation sensitive layer is typically called a photoresist layer. The pattern is transferred to the photoresist layer by exposing the photoresist to some form of light. The light extends through the mask to cross-link the photoresist in the form of the pattern. One of the exposed or unexposed portions of the photoresist is then subsequently removed from the substrate. The device is then etched, or not etched, in those areas of the substrate that are covered by the photoresist.

FIG. 2 illustrates a portion of a wafer 52 that is used in fabricating MEMS device 50. FIGS. 3–4 illustrate a similar wafer 13 in a prior art MEMS device 11 after the wafer 13 has been has been masked and then etched to form a pattern in the wafer 13. The square hole 12 (i.e., pattern) extends downward into the surface 16 of the wafer 13 such the pattern is partially defined by sidewalls 18. The etched pattern forms one or more "square" edges 14 between the surface 16 of the wafer 13 and the sidewalls 18 of the square opening 12. When a mating element, such as an actuator in a disc drive, is inserted into the square opening 12, the square edges 14 have a tendency to chip and crack. This chipping and cracking of the edges 14 generates debris that can negatively effect the operation of the MEMS device and other devices where the MEMS device is used.

FIGS. 5–6 illustrate another typical wafer 19 that has been masked and etched to form a square island 20 on the wafer 19. The square island 20 includes sidewalls 28 that extend upward from an exposed surface 25 of the wafer 19. The island 20 includes similar square edges 22 between the original surface 21 of the wafer 19 and the sidewalls 28 of the island 20. These square edges 22 are similarly vulnerable to chipping and cracking when a mating element is engaged with the island 20. These square edges 22 are also susceptible to damage when the island 20 is grasped by a tweezers or some other handling device to maneuver the wafer 19.

Therefore, what is needed is a MEMS device that is configured to permit mating elements, such as actuators used in disc drives, to be inserted into the MEMS device without damaging the MEMS device. What is also needed is a method of fabricating a MEMS device that permits objects to be inserted into or on the MEMS device with minimal chipping and cracking of the MEMS device.

SUMMARY OF THE INVENTION

The present invention relates to a method of fabricating a MEMS device. The method comprises positioning a mask that is in the form of a pattern relative to the MEMS device, and then etching the pattern into a surface on the MEMS device to form at least one sidewall and an arcuate edge such that the arcuate edge extends between the surface of the MEMS device and one of the sidewalls. The present invention can also be used on a slider of a disc drive to form arcuate or rounded edges.

The present invention also relates to a MEMS device. The MEMS device comprises a body having a surface, and a pattern etched into the surface of the body. The pattern comprises at least one sidewall and an arcuate edge that extends between the surface of the body and one of the sidewalls.

The MEMS device described is configured to facilitate engaging objects, such as actuators that are used in disc drives, with the pattern on the MEMS device. The arcuate edges between the sidewalls in the pattern and the surface of the MEMS device minimize some of the fracturing of the MEMS device that typically occurs when a mating element is inserted on or into the MEMS device. In addition, when the pattern on the MEMS device forms an island on the MEMS device to facilitate handling the MEMS device by the island, the arcuate edges reduce the amount of chipping and cracking fracturing that may be caused by handling the island with any type of handling device.

The functioning of MEMS devices, and surrounding devices may be highly vulnerable to the contamination that results from the chipping and cracking generated when a mating element engages a MEMS device. Therefore, reducing the amount of chipping and cracking associated with engaging mating elements with MEM devices will produce MEMS devices with increased reliability and life expectancy. Forming such a device will also provide for increased reliability and life expectancy of devices in which these MEMs devices are used.

The invention includes semiconductor structures, devices, and methods to form such structures and devices, of varying scope. In addition to the aspects and advantages of the present invention described in this summary, further aspects and advantages of the invention will become apparent by reference to the drawings and by reading the detailed description that follows.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
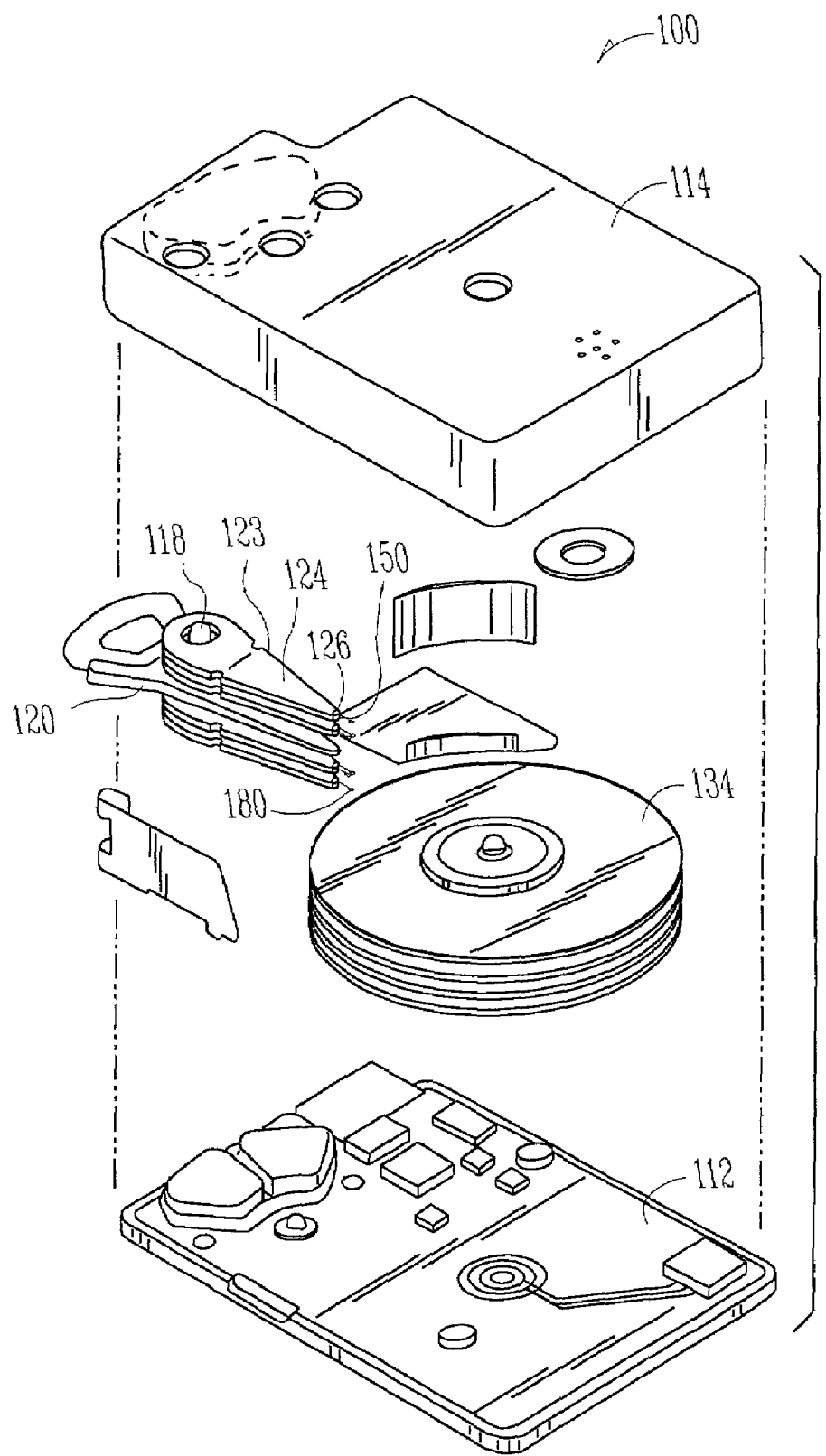
FIG. 1 is an exploded view of a disc drive with a multiple disc stack.

FIG. 1 is an exploded view of one type of a disc drive 100 having a rotary actuator with a micro actuator 180. The disc drive 100 includes a housing or base 112, and a cover 114. The base 112 and cover 114 form a disc enclosure. Rotatably attached to the base 112 on an actuator shaft 118 is an actuator assembly 120. The actuator assembly 120 includes a plurality of arms 123. Attached to the separate arms 123 are load beams or load springs 124. A microactuator 180 is attached to the end of the separate arms and load beams 124. A slider 126 which carries a magnetic transducer 150 is attached at the end of microactuator 180. A microactuator 180 is one device that can be a MEMS device. FIG. 1 illustrates a number of discs 134 within the disc drive, however the invention described herein is equally applicable to disc drives which have a plurality of discs as well as disc drives that have a single disc. In addition, the invention is also useful in all types of disc drives including hard disc drives, zip drives, floppy disc drives and any other type of drive that utilizes MEMS devices. Any MEMS device may use the invention described herein.

Figure 2:
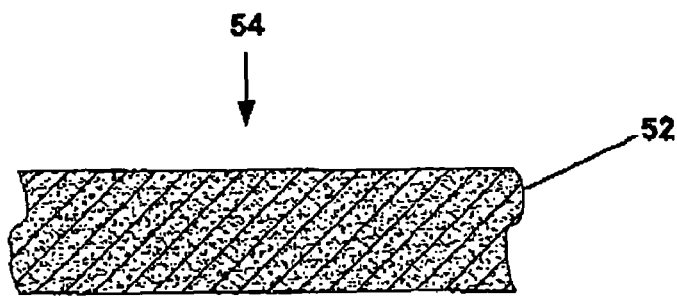
FIG. 2 is a section view illustrating a portion of a typical wafer in a MEMS device.
Figure 3:
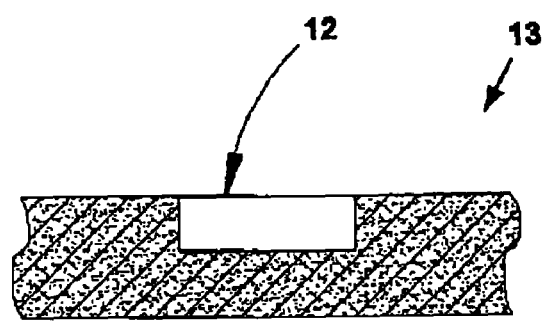
FIG. 3 is a section view similar to FIG. 2 illustrating a wafer in a prior art MEMS device after wafer has been etched to include a square opening.
Figure 4:
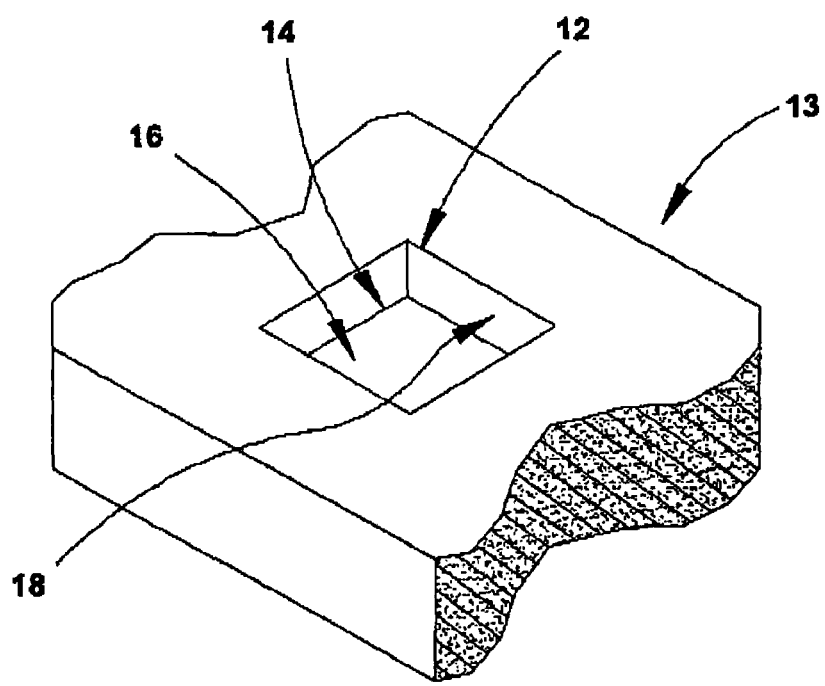
FIG. 4 is a perspective view of the wafer shown in FIG. 3.
Figure 5:
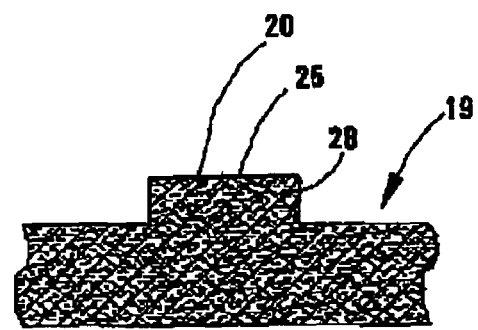
FIG. 5 is a section view similar to FIG. 2 illustrating a wafer in a prior art MEMS device after the wafer has been etched to include a square island.
Figure 6:
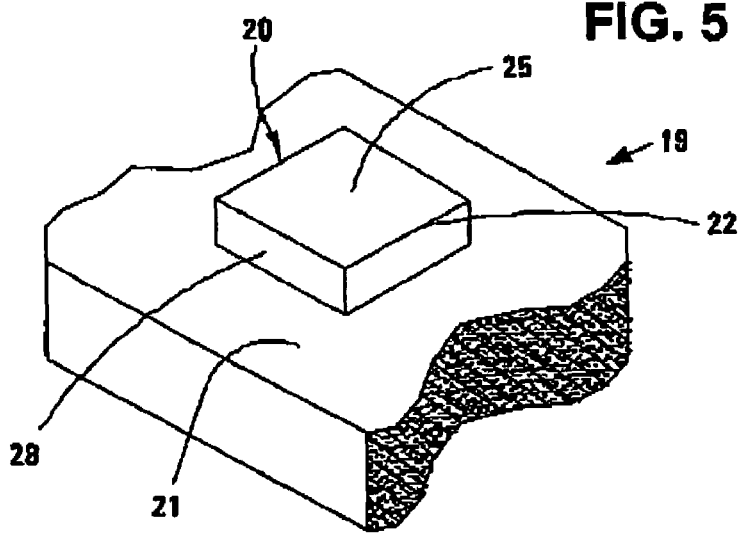
FIG. 6 is a perspective view of the wafer shown in FIG. 5.
Figure 7:
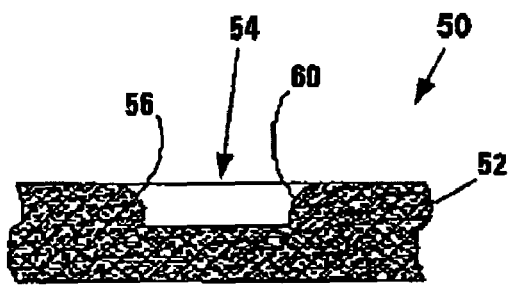
FIG. 7 is a section view illustrating a MEMS device of the present invention.

FIG. 2 is a section view illustrating a portion of a wafer 52 that may be used to fabricate a MEMS device 50. FIG. 7 is a section view similar to FIG. 2 illustrating the wafer 52 after it has been masked and then etched for use in a MEMS device 50 of the present invention. A surface 54 on the wafer 52 is etched to form a pattern in the wafer 52. The pattern comprises sidewalls 56 and an arcuate edge 60.

Figure 8:
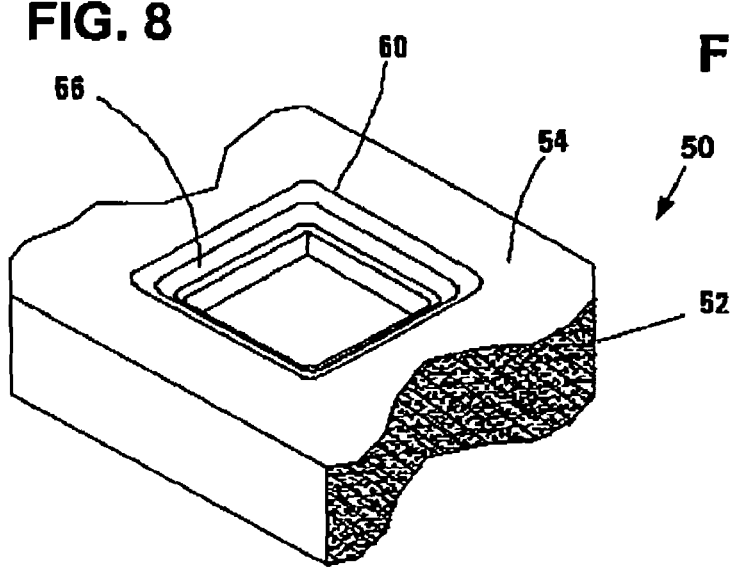
FIG. 8 is a perspective view of the MEMS device shown in FIG. 7 with the MEMS device etched to include a square opening.

FIG. 8 illustrates an embodiment of the MEMS device 50 where the pattern is in the form of a square opening that comprises four sidewalls 56 and an arcuate edge 60. The arcuate edge 60 and the sidewalls 56 are etched into the surface 54 of the wafer 52 such that the arcuate edge 56 is positioned between the each of the sidewalls 56 and the surface 54 of the wafer 52. In an alternative form, the arcuate edge 60 extends around some, one or only a portion of the various sidewalls 56 without departing from the scope of the present invention. The arcuate edge formed as shown is a curved edge and so can be circular or elliptical or made of a portion of a circle or ellipse. It should also be noted that arcuate means other than straight or nearly straight and may include steps or slopes and still be within the scope of this invention.

Figure 9:
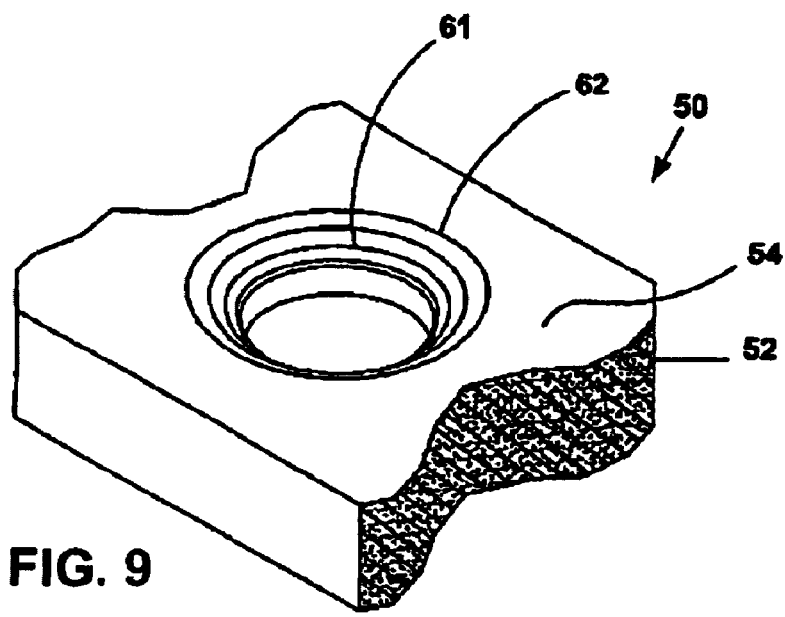
FIG. 9 is a perspective view of the MEMS device shown in FIG. 7 with the MEMS device etched to include a round opening.

A similar embodiment is shown in FIG. 9. In this embodiment, the pattern is in the form of a round opening that comprises a single sidewall 61 and an arcuate edge 62. The arcuate edge 62 is etched between the entire sidewall 61 of the round opening and the surface 54 of the wafer 52, although it should be noted that arcuate edge 62 may extend around only a portion of the sidewall 61.

Figure 10:
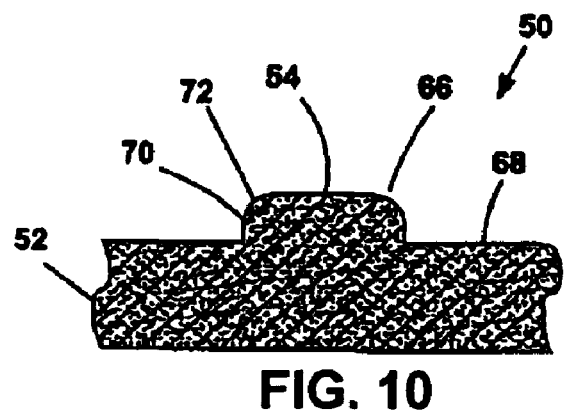
FIG. 10 is a section view illustrating another embodiment of the MEMS device of the present invention.

FIG. 10 illustrates the wafer 52 after it has been masked and then etched for use in another embodiment of the MEMS device 50. The surface 54 on the wafer 52 is etched to form a pattern that leaves an island 66 on a newly exposed surface 68 of the wafer 52. The island 66 comprises one or more side outer walls 70 having an arcuate edge 72. The arcuate edge 72 is an outside arcuate edge on the outside wall.

Figure 11:
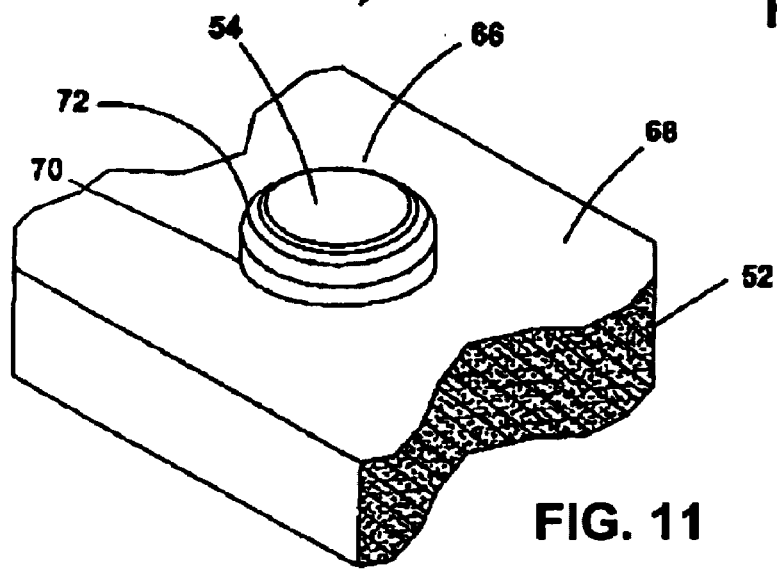
FIG. 11 is a perspective view of the MEMS device shown in FIG. 10 with the MEMS device etched to include a round island.

Referring to FIG. 11, the pattern may form a round island 66 on the exposed surface 68 of the wafer 52. The round island 66 comprises a single sidewall 70 and an arcuate edge 72. The arcuate edge 72 is etched between the entire sidewall 70 of the round opening and the original surface 54 of the wafer 52, although it should be noted that arcuate edge 72 may extend around only a portion of the sidewall 70.

Figure 12:
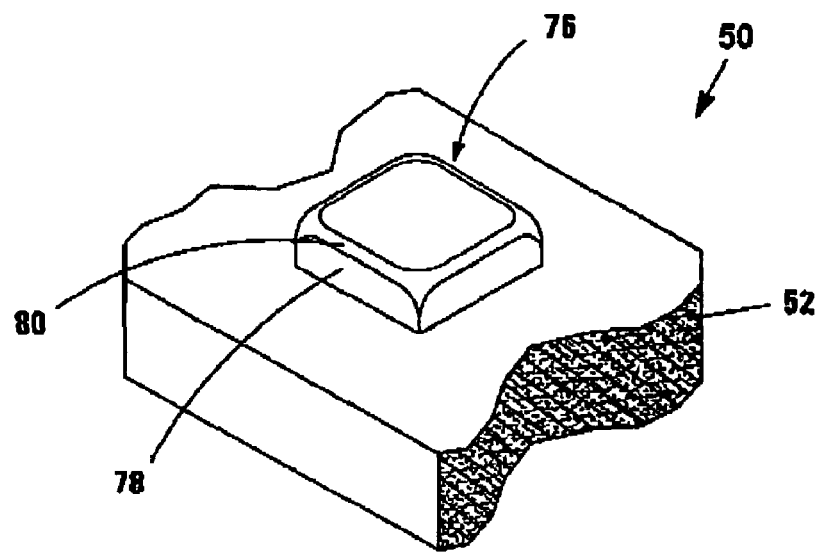
FIG. 12 is a perspective view of the MEMS device shown in FIG. 10 with the MEMS device etched to include a square island.

As shown in FIG. 12, the pattern may also form a square island 76 on the wafer 52. The square island 76 comprises four sidewalls 78 and an arcuate edge 80. The arcuate edge 80 and the sidewalls 78 are etched into the surface 54 of the wafer 52 such that the arcuate edge 80 is positioned between the each of the sidewalls 78 and the original surface 54 of the wafer 52. In an alternative form, the arcuate edge 80 extends around some, one or only a portion of the various sidewalls 78.

Figure 13:
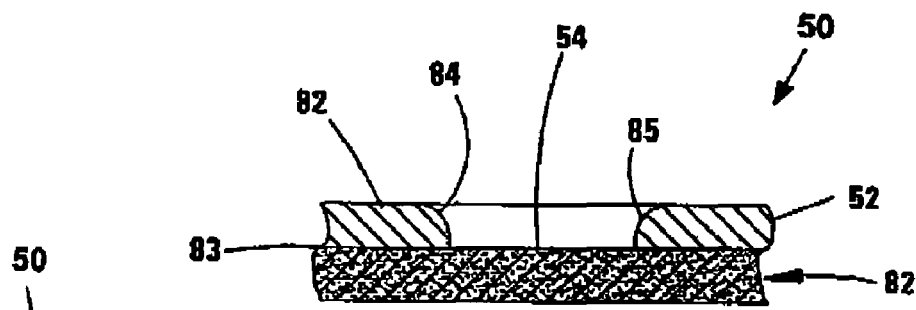
FIG. 13 is a section view illustrating a two-layered MEMS device of the present invention.
Figure 14:
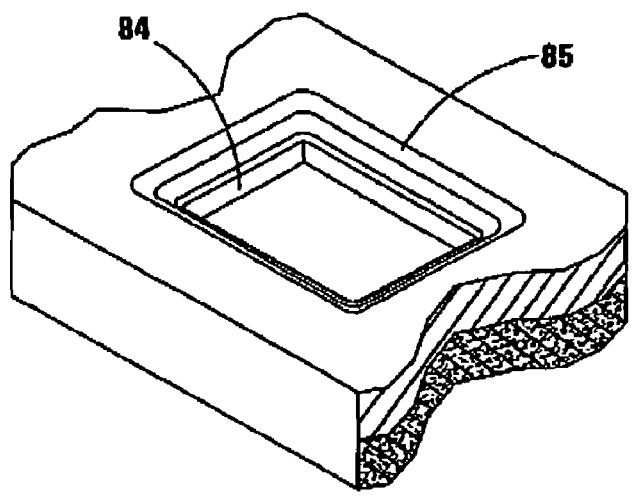
FIG. 14 is a perspective view of the MEMS device shown in FIG. 13 with the upper layer of the MEMS device etched to include a rectangular opening.

FIGS. 13 and 14 illustrate another embodiment of the MEMS device 50 of the present invention. In this embodiment, the MEMS device 50 includes two layers. The two-layered MEMS device 50 is formed by overlaying the wafer 52 with a layer 82 that is made from a different material. There are numerous layering techniques and types of layering materials that are well known to those skilled in the art. Any number of these techniques or materials may be used to form the layer 82 on the wafer 52 without departing from the scope of the present invention. The surface 83 of the layer 82 is etched to form a pattern in the layer 82. The pattern is etched downward from the surface 83 of the layer 82 until the surface 54 of the wafer 52 is exposed. Although any other pattern could be etched into layer 82, the pattern illustrated in FIGS. 13 and 14 is in the form of a rectangular opening that comprises four sidewalls 84 and an arcuate edge 85. The arcuate edge 85 and the sidewalls 84 are etched into the surface 83 of the wafer 82 such that the arcuate edge 85 is positioned between the each of the sidewalls 84 and the surface 83 of the layer 82.

Figure 15:
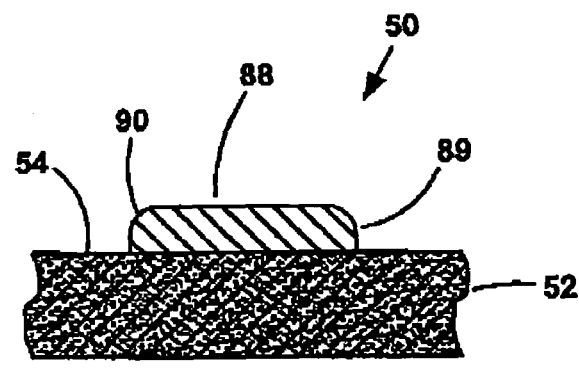
FIG. 15 is a section view illustrating another embodiment of a two-layered MEMS device of the present invention.
Figure 16:
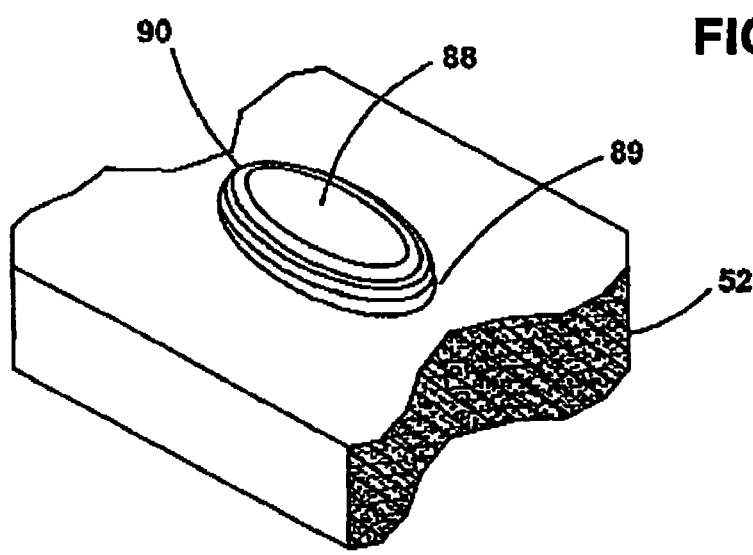
FIG. 16 is a perspective view of the MEMS device shown in FIG. 15 with the upper layer of the MEMS device etched to include an oval-shaped island.

FIGS. 15 and 16 illustrate another embodiment of the MEMS device 50 that includes two layers. In this embodiment, the surface 83 of the layer 82 is etched with a pattern that forms an oval-shaped island 88 on the exposed surface 54 of the wafer 52. The pattern comprises a single sidewall 89 and an arcuate edge 90. The arcuate edge 90 is etched between the entire sidewall 89 of the oval-shaped island 88 and the original surface 83 of the layer 82.

Figure 17:
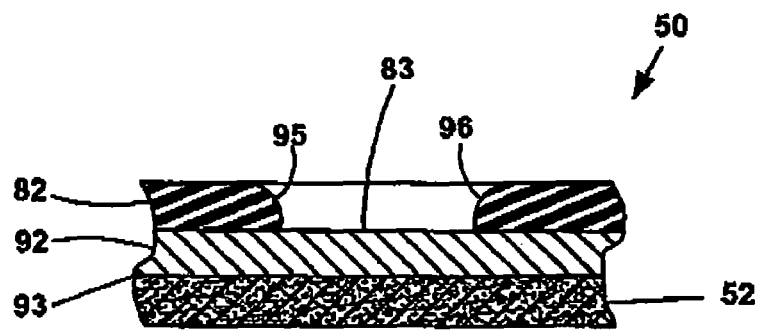
FIG. 17 is a section view illustrating a three-layered MEMS device of the present invention.

The MEMS device 50 may include any number of layers without departing from the scope of the present invention. A MEMS device 50 having three layers is shown in FIG. 17. The wafer 52 is covered with a first layer 82 (e.g. a conducting layer) and then a second layer 92 (e.g., an insulating layer). A surface 93 of the second layer 92 is etched to form a pattern in the second layer 93. The pattern comprises a sidewall 95 and an arcuate edge 96. The pattern is etched downward from the surface 93 of the second layer 92 until the surface 83 of the first layer 82 is exposed. The first layer 82 may be further etched to expose the original surface 54 of the wafer 52 depending on the circuit design of the MEMS device 50.

Figure 18:
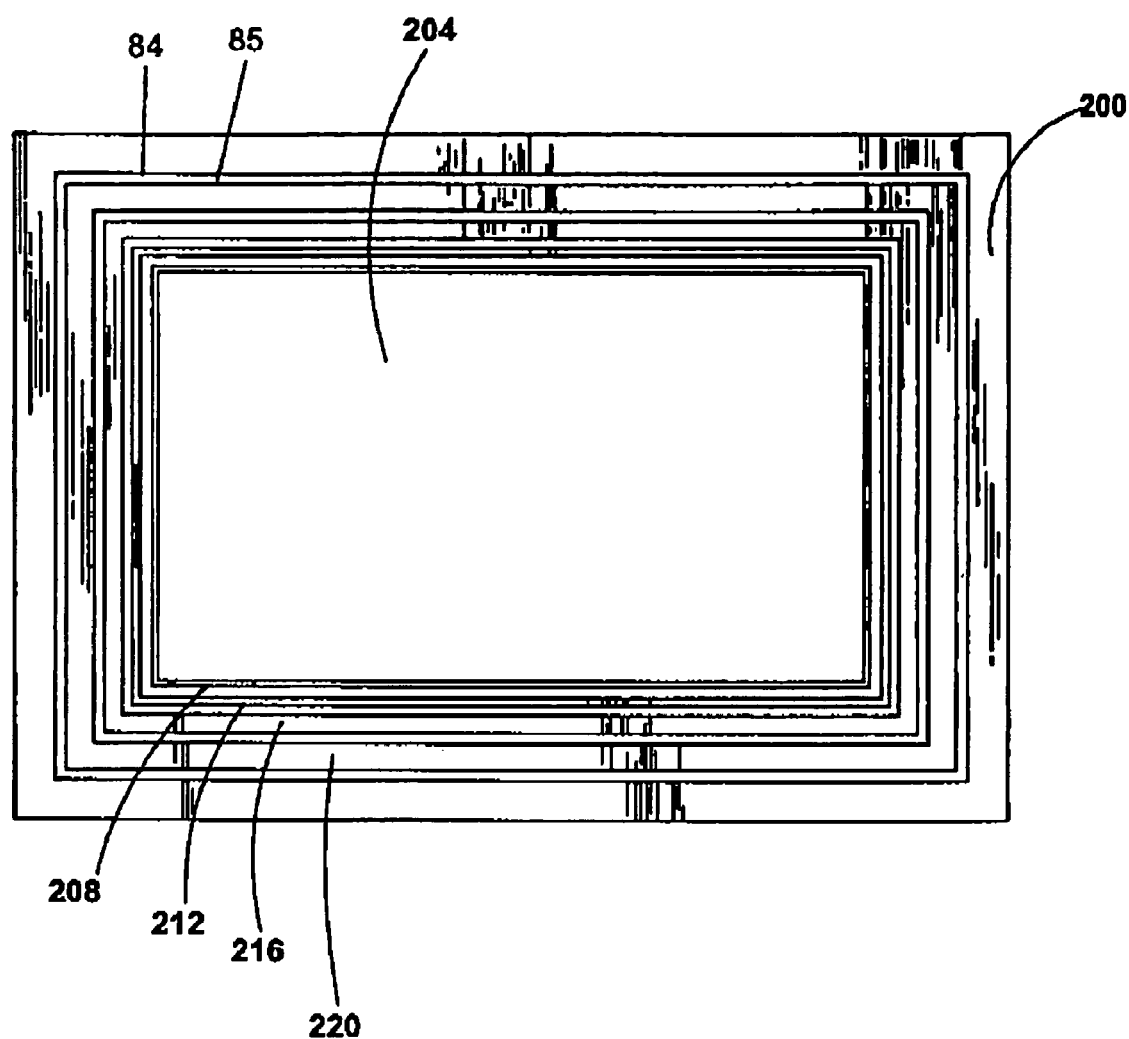
FIG. 18 is a plan view illustrating one form of a mask that could be used to fabricate the MEMS device shown in FIG. 9.

The MEMs device 50 of the present invention could be masked using any method of masking that is now known or yet to be discovered. One form of a mask 200 that may be used to fabricate the arcuate edges in a MEMS device 50 of the present invention is shown in FIG. 18. The mask 200 is used to fabricate a pattern in a MEMS device 50 that is similar to the rectangular opening in the layer 82 of the MEMS device shown in FIG. 14. The mask 200 includes a large center opening 204. Passing light, or some other medium, through the center opening 204 in the mask 200 contributes to forming the sidewalls 84 in the pattern. The center opening 204 is bordered by additional concentric openings 208, 212, 216, 220. The space between the openings 208, 212, 216, 220 increases as the openings 208, 212, 216, 220 move outward toward an outside edge 224 of the photomask 200. Therefore, more light passes through the photomask 200 near the center opening 204 than at the outside edge 224. Passing this graduated dispersion of the light between the openings 208, 212, 216, 220 contributes to similarly graduated etching that forms the arcuate edges 85 between the sidewalls 84 in the pattern and the surface 83 of the layer 82 on the MEMS device 50.

The size of the openings 208, 212, 216, 220 in the mask 200 may also be varied to facilitate etching the arcuate edges 85 in the pattern. Each opening 208, 212, 216, 220 would become increasingly smaller as the distance of each opening 208, 212, 216, 220 from the center opening 204 increases.

The MEMS device 50 of the present invention may also be etched using any etching method that is known or yet to be discovered. The etching may be wet or dry depending on the circuit design of the MEMS device 50. The potential types of etching include, but are not limited to; (i) immersing or spraying a liquid at the surface of the MEMS device 50; (ii) exposing the surface of the MEMS device 50 to a vapor or plasma; and/or (iii) directing an electron stream, x-rays or ions (reactive and non-reactive) at the surface of the MEMS device 50.

The MEMS device 50 described is configured to facilitate engaging mating elements, such as actuators that are used in disc drives, with a pattern on the MEMS device 50. The arcuate edges in all of disclosed embodiments of the MEMS devices 50 minimize the fracturing of the MEMS devices 50 that typically occurs when a mating element is inserted on or into a MEMS device 50. In addition, when the etched pattern forms an island (FIGS. 11, 12, 15 and 16) on the MEMS device 50 to facilitate handling the MEMS device 50 by the island, the arcuate edges reduce the amount of chipping and cracking that may be caused by handling the island with tweezers or any other type of handling device.

Although the invention describes the forming of a pattern on a MEMS device, it should be noted that the technique can be used to form such a pattern on any device including a slider for a disc drive or other device. The techniques and apparatus described herein are not limited to only MEMS devices but can be used to form all devices.

In conclusion, a method for topographically patterning a MEMS device is disclosed. The method comprises the steps of positioning a mask that is in the form of a pattern relative to the MEMS device and etching the pattern into a surface on the MEMS device 50 to form at least one sidewall and an arcuate edge between the surface and one of the sidewalls. It should be noted that the etching step may form an opening in the surface of MEMS device 50 or form an island on a newly exposed surface. The method may further comprise engaging a mating element with the pattern on the MEMS device 50 such that the arcuate edge formed during the etching step permits the mating element to be engaged with the pattern with little or no fracturing of the MEMS device 50. In addition, the arcuate edge may extend along all, some or a portion of any sidewall in the pattern. The etching step may also comprise (i) immersing the MEMS device 50; (ii) spraying a liquid against the surface of the MEMS device 50; (iii) exposing the surface of the MEMS device 50 to a vapor or plasma; and (iv) directing an ion beam, stream of electrons and/or x-rays at the surface of the MEMS device 50. The MEMS device 50 may also comprise more than one layer such that the etching is done into one or more of the layers that make up the MEMS device 50.

Also disclosed is a MEMS device 50 that comprises a body having a surface, and a pattern etched into the body. The etched pattern comprises at least one sidewall and an arcuate edge that is positioned between the surface of the body and one of the sidewalls. The arcuate edge facilitates engaging a mating element, such as an actuator, with the pattern. The body may also comprise two or more layers that are made from different materials with the pattern being etched into one or more of the layers.

The invention generally relates to a MEMS device that comprises a body having one or more layers. The body comprises means for engaging a mating element with one of the layers in the body. The means for engaging a mating element with one of the layers in the body minimizes any fracturing within the body that might occur when the mating element is engaged with the body.

It is to be understood that the above description is intended to be illustrative, and not restrictive. Many other embodiments will be apparent to those of skill in the art upon reviewing the above description. The scope of the invention should be determined with reference to the appended claims along with the full scope of equivalents to which such claims are entitled.

What is claimed is:

1. A method for topographical patterning of a MEMS device, the method comprising the steps of:
    (a) positioning a mask relative to the device, the mask being in the form of a pattern, wherein the mask exposes a surface of the device;
    (b) etching the pattern into a surface of the device to form a feature, wherein said feature includes at least one rounded edge; and
    (c) providing a mating element and connecting said mating element and said feature, wherein the mating element is an actuator in a disc drive.

2. The method of claim 1, wherein the feature is formed into the surface of the device.

3. The method of claim 2, wherein the feature is selected from at least one of a rounded shape, an oval shape, or a square shape.

4. The method of claim 1, wherein the feature is protruding from the surface of the device.

5. The method of claim 4, wherein the feature is selected from at least one of a rounded shape, an oval shape, or a square shape.

6. The method of claim 1, wherein the rounded edge is an arcuate edge.

7. The method of claim 1, wherein the pattern of the mask is formed wit variable spacings to produce the rounded edge.

8. The method of claim 7, wherein the variable spacings in the pattern of the mask are varied to vary the rounded shape.

9. The method of claim 1, wherein the etching step (b) comprises immersing the device within a liquid.

10. The method of claim 1, wherein the etching step (b) comprises spraying a liquid against the surface of the device.

11. The method of claim 1, wherein the etching step (b) comprises exposing the surface of the device to a vapor.

12. The method of claim 1, wherein the etching step (b) comprises exposing the surface of the device to a plasma.

13. The method of claim 1, wherein the etching step (b) comprises directing an ion beam at the surface of the device.

14. The method of claim 1, wherein the device comprises more than one layer and the etching step (b) comprises etching into one or more of the layers.

15. The method of claim 1, wherein the rounded edge is an arcuate edge.

16. A method for topographical patterning of a MEMS device, the method comprising the steps of:
    (a) etching a pattern into a surface of the MEMS device to form a feature, wherein said feature includes at least one rounded edge; and
    (b) providing a mating element; and
    (e) inserting the mating element into the feature, wherein the rounded edge reduces damage to the feature.

17. The method of claim 16, wherein the feature is formed into the surface of the device.

18. The method of claim 2, wherein the feature is selected from at least one of a rounded shape, an oval shape, or a square shape.

19. The method of claim 16, wherein the etching step (a) comprises immersing the device within a liquid.

20. The method of claim 16, wherein the etching step (a) comprises directing an ion beam at the surface of the device.

* * * * *